United States Patent
Bellorado et al.

(10) Patent No.: US 9,236,147 B1
(45) Date of Patent: Jan. 12, 2016

(54) THRESHOLD CARRYING FOR SOLID STATE STORAGE

(71) Applicant: SK Hynix Inc., Gyeonggi-do, CA (US)

(72) Inventors: Jason Bellorado, San Jose, CA (US); Ameen Aslam, Santa Clara, CA (US); Zheng Wu, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/493,216

(22) Filed: Sep. 22, 2014

Related U.S. Application Data

(60) Provisional application No. 61/915,357, filed on Dec. 12, 2013.

(51) Int. Cl.
  *G06F 17/50*  (2006.01)
  *G11C 29/50*  (2006.01)
  *G06F 11/10*  (2006.01)

(52) U.S. Cl.
  CPC ...... *G11C 29/50004* (2013.01); *G06F 11/1072* (2013.01); *G11C 2029/5004* (2013.01)

(58) Field of Classification Search
  CPC .............................. G06F 11/1008; G11C 16/34
  USPC ..................................... 716/100, 138
  See application file for complete search history.

(56) References Cited

U.S. PATENT DOCUMENTS

| | | | |
|---|---|---|---|
| 7,975,192 B2 | 7/2011 | Sommer et al. | |
| 8,068,360 B2 * | 11/2011 | Anholt | 365/185.03 |
| 8,259,497 B2 * | 9/2012 | Shalvi et al. | 365/185.09 |

* cited by examiner

*Primary Examiner* — Sun Lin
(74) *Attorney, Agent, or Firm* — IP & T Group LLP

(57) ABSTRACT

An instruction to read at least a portion of a superblock is received where the superblock is stored on at least a first solid state storage die. It is determined if adjusted threshold information, associated with the first solid state storage die and the superblock, is stored. If it is determined that adjusted threshold information is not stored, then an adjusted threshold is determined and a read is performed on the first solid state storage die using the determined adjusted threshold. If it is determined that adjusted threshold information is stored, then a read is performed on the first solid state storage die using the stored adjusted threshold information.

23 Claims, 8 Drawing Sheets

For Die 0:

| | |
|---|---|
| A Threshold Offset | +4 |
| B Threshold Offset | -- |
| C Threshold Offset | +3 |
| Superblock No. | 12 |

For Die 1:

| | |
|---|---|
| A Threshold Offset | -- |
| B Threshold Offset | -- |
| C Threshold Offset | -- |
| Superblock No. | -- |

FIG. 3

THRESHOLD CARRYING FOR SOLID STATE STORAGE

CROSS REFERENCE TO OTHER APPLICATIONS

This application claims priority to U.S. Provisional Patent Application No. 61/915,357 entitled THRESHOLD CARRYING FOR NAND DEVICES filed Dec. 12, 2013 which is incorporated herein by reference for all purposes.

BACKGROUND OF THE INVENTION

Solid state storage has become increasingly popular and is now used in a variety of systems. Many such systems have the ability to go into a lower power sleep mode. In some cases, the system will expect the solid state storage to become responsive within a certain amount of time when instructed to come out of sleep mode. However, some current solid state storage devices, after being heavily cycled, are unable to respond quickly enough and a timeout failure occurs. New solid state storage devices and/or techniques which are able to more quickly come out of sleep mode, even when they are heavily cycled, would be desirable.

BRIEF DESCRIPTION OF THE DRAWINGS

Various embodiments of the invention are disclosed in the following detailed description and the accompanying drawings.

FIG. 3 is a diagram illustrating an embodiment of stored adjusted threshold information.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
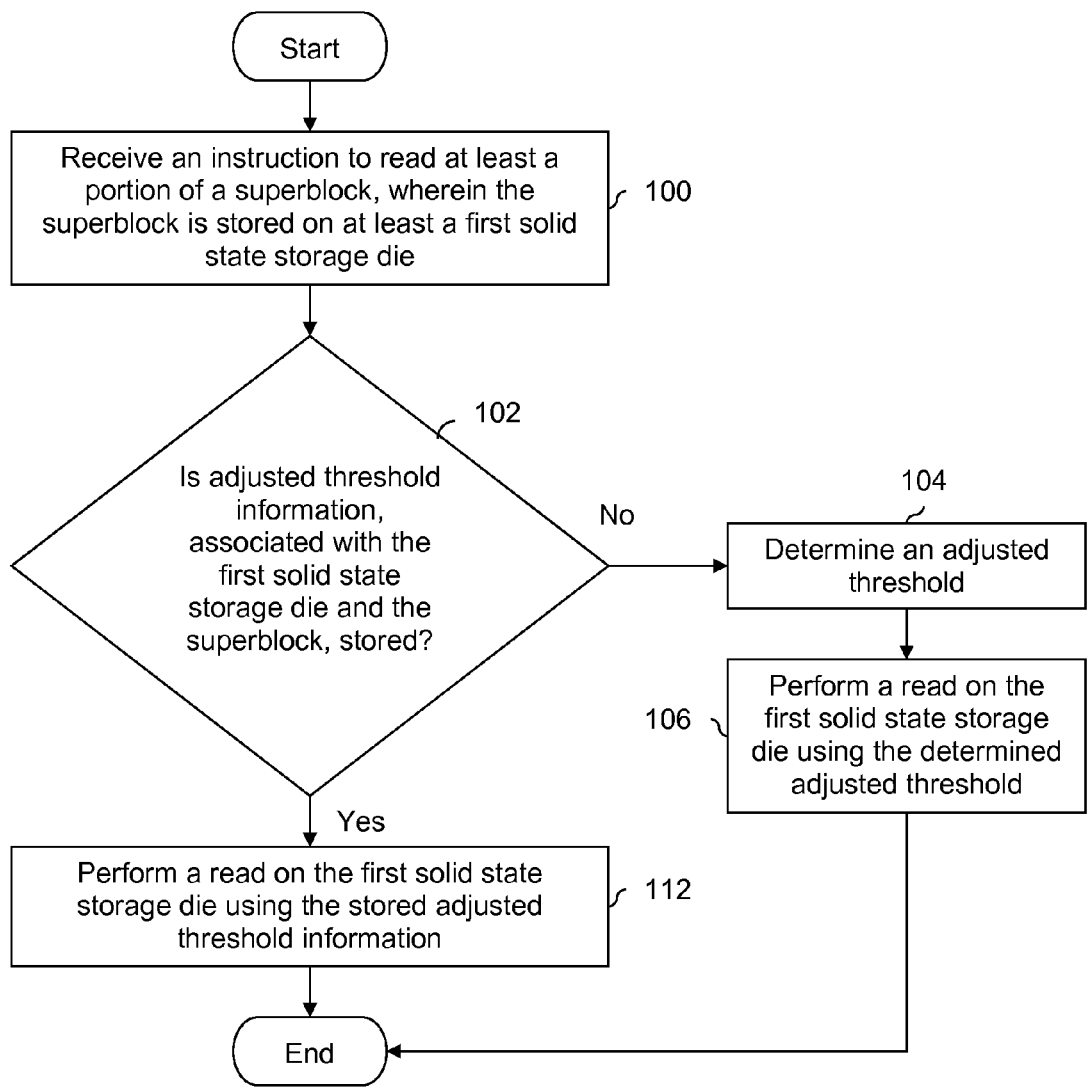
FIG. 1 is a flowchart illustrating an embodiment of a process for reusing adjusted threshold information based on die and superblock.

FIG. 1 is a flowchart illustrating an embodiment of a process for reusing adjusted threshold information based on die and superblock. In some embodiments, the process is performed by a storage controller. In some embodiments, the process is performed by a semiconductor device, such as a field-programmable gate array (FPGA) or an application-specific integrated circuit (ASIC). In some embodiments, the process of FIG. 1 is performed in the event a read using a default threshold returns read-back data which is unable to be corrected using an error correction encoder (i.e., reading using a default threshold fails).

At 100, an instruction to read at least a portion of a superblock is received, wherein the superblock is stored on at least a first solid state storage die. In some embodiments, the read instruction is received from a host or firmware. In some embodiments, an address or location specified in the read instruction may be a logical address or location (e.g., a logical block address) or a physical address or location. In some embodiments, the superblock is not explicitly specified in the instruction, but the superblock may be determined using some mapping (e.g., a mapping from block to superblock, a mapping from logical block address to superblock, etc.). For example, the instruction may be to read one or more specified blocks, where the specified blocks are associated with a particular superblock. The following figure shows one example of a superblock.

Figure 2:
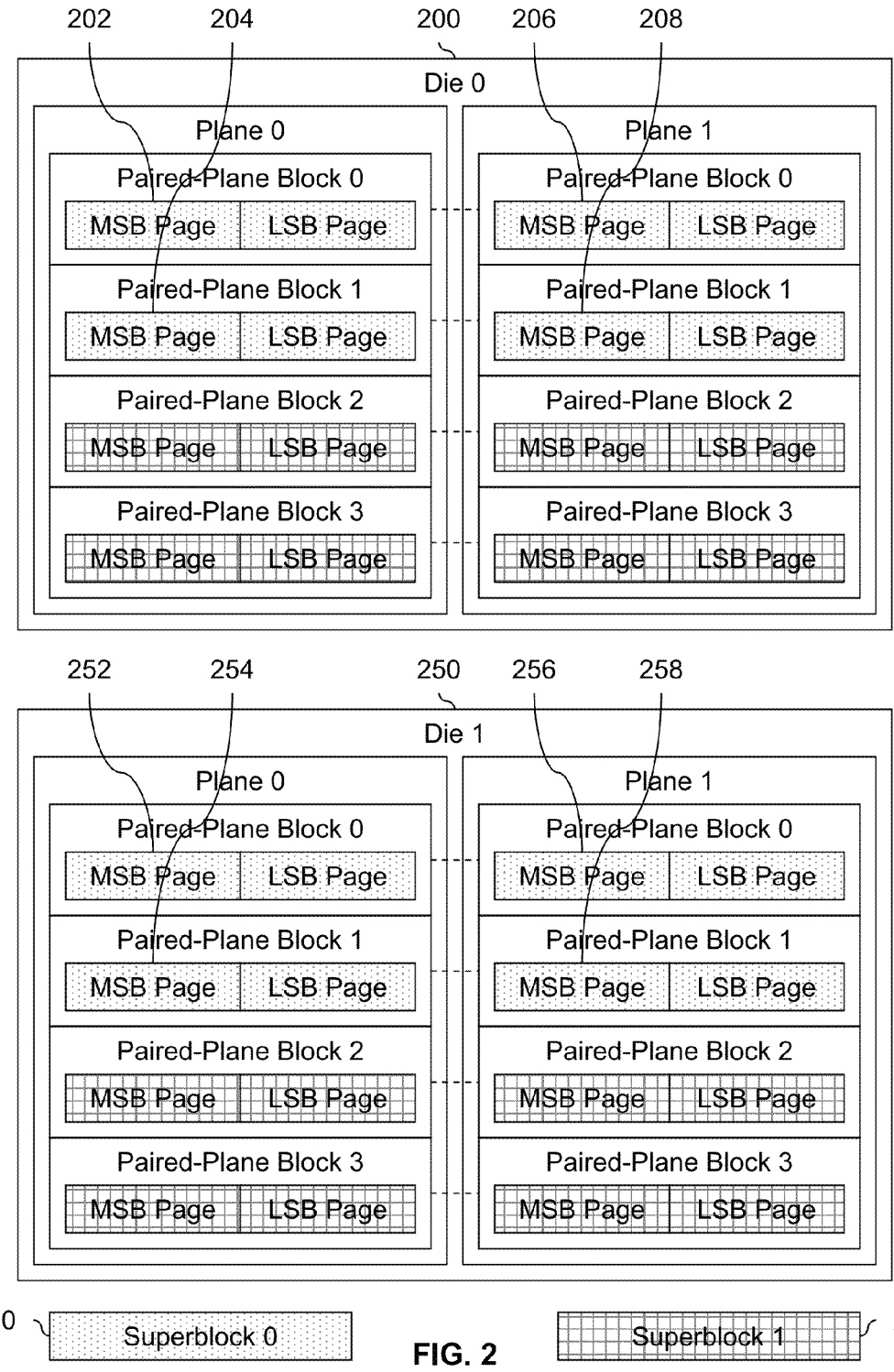
FIG. 2 is a diagram illustrating an embodiment of a superblock. In the example shown, there are two dice.

FIG. 2 is a diagram illustrating an embodiment of a superblock. In the example shown, there are two dice. Each die in this example includes two planes and each plane in turn includes 4 blocks. Each block includes a most significant bit (MSB) page and a least significant bit (LSB) page. In this particular example, the storage is multi-level cell (MLC) storage where each cell stores two bits. One page (i.e., the LSB page) in each block is used to store one or more least significant bits and the other page (i.e., the MSB page) is used to store one or more most significant bits.

Superblocks are logical constructs consisting of smaller pieces of data which are physically spread out over one or more dice. In this particular example there are two superblocks. The first superblock (210) includes blocks 0 and 1 from plane 0 on die 0, blocks 0 and 1 from plane 1 on die 0, blocks 0 and 1 from plane 0 on die 1, and blocks 0 and 1 from plane 1 on die 1. The second superblock (212) includes blocks 2 and 3 from plane 0 on die 0, blocks 2 and 3 from plane 1 on die 0, blocks 2 and 3 from plane 0 on die 1, and blocks 2 and 3 from plane 1 on die 1.

In one example of an instruction received at step 100 in FIG. 1, an instruction to read MSB page 202 is received.

In another example of an instruction received at step 100, an instruction to read MSB pages 202 and 206 in parallel is received. In this particular example, the planes are paired where corresponding blocks in the two planes (in the same die) are able to perform the same operation in parallel. So, for example, MSB pages 202 and 206 are able to be read in parallel. However, MSB page 202 cannot be read while MSB page 206 is being erased because the operations are different.

It is noted that each die in this example has an independent channel (not shown) between itself and the storage controller (not shown). This enables die 200 to operate independently of die 250 and, as such, it is possible to perform one type of operation (e.g., read, program, or erase) on die 200 while a different type of operation is being performed on die 250. For example, it is possible to read MSB page 202 on die 200 while erasing MSB page 252 on die 250.

The configurations shown in this figure are merely exemplary and are not intended to be limiting. For example, some other superblock embodiments may comprise some other combination of pages, blocks and such, and/or may comprise some other physical layout than the example shown herein. In some embodiments, a different number of dice, planes, blocks, pages, etc. are used. In some embodiments, dual planes are not used. In various other embodiments, single-level cell (SLC) storage is used where only a single bit is stored per cell, tri-level cell (TLC) storage is used where each cell stores 3 bits, etc.

Returning to FIG. 1, at 102, it is determined if adjusted threshold information, associated with the first solid state storage die and the superblock, stored. For example, a storage controller may check in local and/or quickly accessible memory if there is adjusted threshold information that is associated with both the die and the superblock of interest. The following figure shows an example of stored adjusted threshold information.

FIG. 3 is a diagram illustrating an embodiment of stored adjusted threshold information. In the example shown, the adjusted threshold information which is stored comprises an offset or a difference between a default threshold and a corresponding adjusted threshold. In this example, offsets are stored because fewer bits are required. For example, to store the actual adjusted threshold may require 7 or 8 bits, but to store an offset may only require 4 or 5 bits. Naturally, this example is merely exemplary and is not intended to be limiting. That is, in some applications the actual adjusted threshold is saved.

In this particular example, an A threshold offset of +4 and a C threshold offset of +3 are stored in memory corresponding to die 0, for example because an instruction to read an MSB page associated with superblock 12 and die 0 was received and performed. The superblock number (i.e., 12) is also stored. At the point in time shown, no adjusted threshold information has been stored for die 1.

In some embodiments, to save space, a B threshold offset (e.g., associated with reading an LSB page) may be stored in the same entry as an A threshold offset and a C threshold offset (e.g., associated with reading an MSB page). The LSB/MSB adjusted threshold information may have been determined for different blocks or pages and/or at different times, but since they correspond the same superblock and same die, they can be stored together.

In some embodiments, the adjusted threshold information is stored in volatile memory. Non-volatile memory may be limited because it is expensive and other information which needs to be recoverable after a power down may need to be stored therein. In contrast, it may be acceptable if stored adjusted threshold information is lost in the event of a power down since that information can be relearned and the system is able to operate without the stored adjusted threshold information (albeit slower).

Naturally, any number of sets of adjusted threshold information may be stored per die and the example shown herein is merely exemplary and is not intended to be limiting. In another example, three sets of MLC adjusted threshold information are stored per die where each set of MLC adjusted threshold information includes an A threshold offset, a B threshold offset, a C threshold offset, and a superblock number. If the memory is full and some of the information stored needs to be discarded, then any appropriate eviction technique may be used. In some embodiments, the oldest set of information is evicted when space is needed.

Returning to FIG. 1, if it is determined at 102 that adjusted threshold information, associated with the first solid state storage die and the superblock, is not stored, then at 104 an adjusted threshold is determined. An adjusted threshold is merely a threshold which is different from the default threshold and any appropriate technique to determine an adjusted threshold may be used. In some embodiments, determining an adjusted threshold includes performing optimal threshold estimation, where an optimal threshold (e.g., corresponding to the voltage at which two adjacent distributions intersect) is estimated. The following figure shows some examples of adjusted thresholds.

Figure 4:
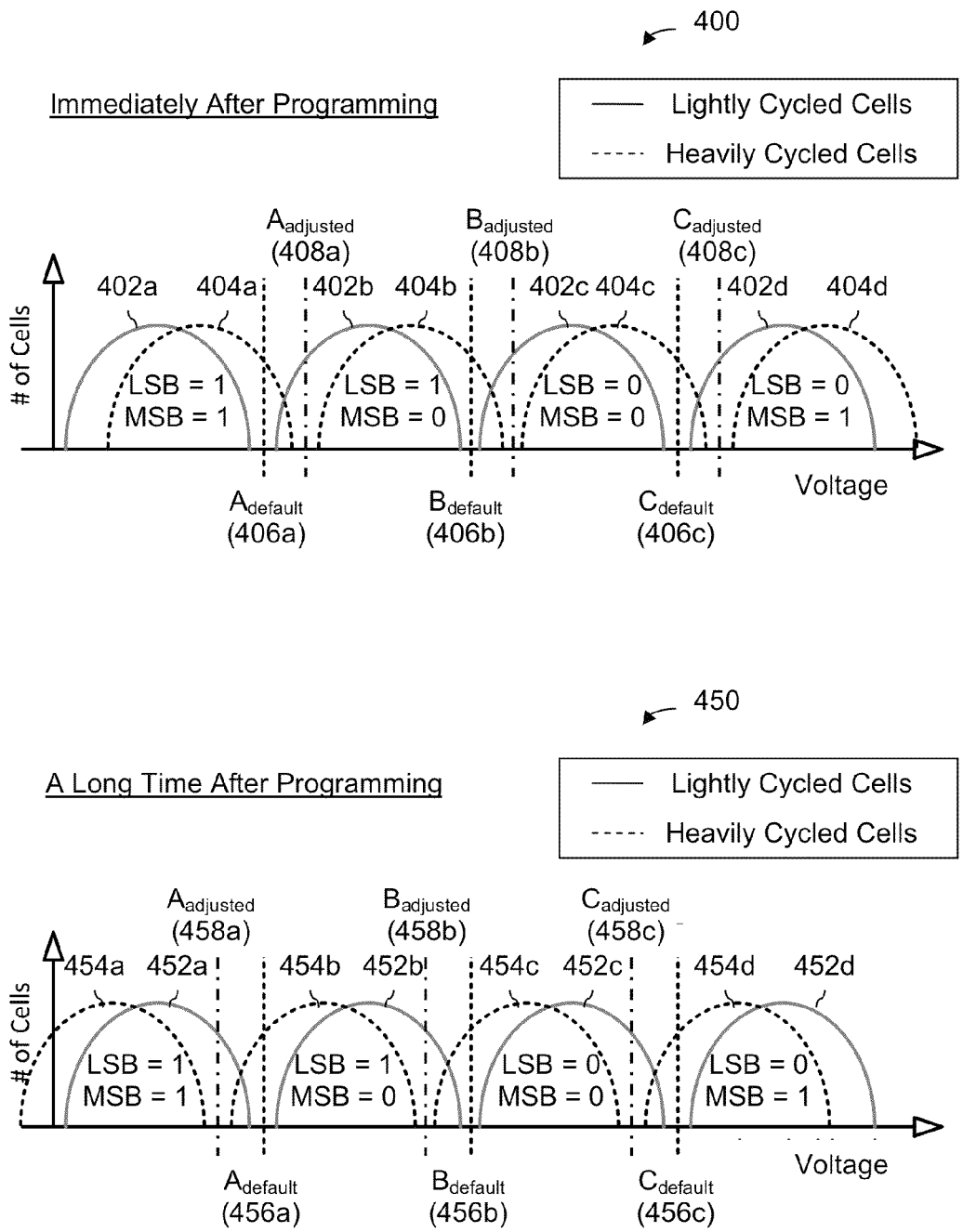
FIG. 4 is a diagram illustrating some embodiments of adjusted thresholds.

FIG. 4 is a diagram illustrating some embodiments of adjusted thresholds. In the example shown, the solid state storage comprises MLC storage where each cell stores two bits. In diagrams 400 and 450, two sets of distributions are shown. Distributions which are shown with an unbroken line correspond to lightly cycled cells which have been programmed and erased relatively few times. Distributions which are shown with a dashed line correspond to heavily cycled cells which have been programmed and erased a relatively large number of times.

Repeated programming and erasing causes the electrical insulation of a cell to break down. As such, lightly cycled cells are good electrical insulators while heavily cycled cells are poor electrical insulators. This difference is reflected in the centers of the distributions. Diagram 400, for example, shows the two types of cells immediately after programming. Distributions 404a-404d (which are associated with heavily cycled cells with poor electrical insulation) have a higher center since they more readily accept voltage when being programmed compared to lightly cycled cells with better electrical insulation. (This is similar to how the inside of a house with poor thermal insulation will be hotter on a hot day compared to a house with good thermal insulation.) Also, although it may not be readily apparent from diagram 400, the width (e.g., corresponding to variance or a standard deviation) of distributions 404a-404d tends to be wider than distributions 402a-402d.

Diagram 450 shows the two types of cells a long time after programming. Lightly cycled cells, with good electrical insulation, will be able to retain their stored voltage with very little leakage. Heavily cycled cells, in contrast, will leak charge because of their poor electrical insulation. To use the thermal analogy again, a house with good thermal insulation will lose very little heat to the outside on a cold day whereas a house with poor thermal insulation will lose much more heat. As such, the centers of distributions 454a-454d (associated with the heavily cycled cells) in diagram 450 are lower than distributions 452a-452d (associated with the lightly cycled cells).

To read MLC storage, one or more thresholds must be specified. To read the LSB, a single B threshold is used. If the stored voltage of a cell is less than the B threshold being used, then an LSB of 1 is read. Otherwise, an LSB of 0 is read. To read the MSB, two thresholds must be used: the A threshold and the C threshold. If the stored voltage is either less than the A threshold being used, or is greater than the C threshold being used, then an MSB of 1 is read. Otherwise, if the stored voltage is between the A threshold being used and the C threshold being used, then an MSB of 0 is read.

As diagrams 400 and 450 show, default thresholds 406a-406c and 456a-456c are acceptable for reading distributions 402a-402d and 452a-452d, but are probably not appropriate for reading distributions 404a-404d and 454a-454d since too many bit errors would probably be read back with those default thresholds. Instead, adjusted thresholds 408a-408c and 458a-458c are more appropriate (respectively) for reading for reading distributions 404a-404d and 454a-454d. Adjusted thresholds 408a-408c and 458a-458c are some examples of adjusted thresholds which are determined at step 104 in FIG. 1. As described above, any appropriate technique to determine an adjusted threshold may be used.

Returning to FIG. 1, at 106, a read is performed on the first solid state storage die using the determined adjusted threshold. In some embodiments, determining an adjusted threshold at 104 includes performing one or more test reads where the test results are not returned to the firmware or host. In contrast, the results of the read performed at 106 are returned to the firmware or host. In some embodiments, error correction decoding is performed on the data read back at step 106.

At some point in the path that includes steps 104 and 106, the adjusted thresholds (e.g., determined by an optimal threshold estimator) are stored in memory. For example, the memory associated with die 0 and/or die 1 in FIG. 3 may be updated. If the memory for a particular die is full, then one of the sets of stored information is discarded using any appropriate eviction technique.

If it is determined at 102 that adjusted threshold information, associated with the first solid state storage die and the superblock, is stored, then a read is performed on the first solid state storage die using the stored adjusted threshold information at 112. For example, a storage controller may keep the adjusted threshold information locally (i.e., on the storage controller itself as opposed to on the solid state storage) for quick accessibility.

The decision at step 102 is not necessarily looking for an exact match between the (e.g., physical) location which was used to generate the stored adjusted threshold information and the (e.g., physical) location which is currently being read. For example, the adjusted threshold information may have been generated for a first block (page) at step 104 (e.g., page 202 in FIG. 2) but it may be reused for a second block (page) at step 112 (e.g., page 204 in FIG. 2) so long as the blocks (pages) are associated with the same superblock and are on the same die.

Whether or not an adjusted threshold generated for one block (or other unit of data being read) is a good threshold to use for another block will depend upon at least two things: (1) how similar the two blocks are with respect to wear (e.g., as measured by the program and erase count) and (2) how similar the two are as a result of the manufacturing process. In regards to the latter, an adjusted threshold generated for a block on one die is typically not a good adjusted threshold to use for another block on another die because of manufacturing inconsistencies or differences. Even two blocks on the same die may have significant differences, and so it is preferable to use adjusted threshold information (generated for another block) only when the two blocks are relatively close to each other on the same die.

The nature and usage of superblocks satisfies both factors, at least for blocks on the same die and associated with the same superblock. With respect to similarity in wear, firmware often treats a superblock as a single unit, in that operations (e.g., programming and erasing) are performed across all constituent blocks. Since all blocks in the superblock are programmed and erased at the same time, all blocks in a given superblock have the same program and erase count (i.e., they are cycled or worn to the same degree). With respect to how close the blocks are to each other on the same die, blocks associated with the same superblock tend to be placed next to each other on a given die. As such, adjusted information generated for one block in a given superblock can be reused with satisfactory results for another block in the same superblock, so long as both blocks are on the same die.

It is noted that blocks in paired planes behave in a similar manner, and so adjusted threshold information generated for one block in a first plane may be reused for another block on a second plane, again so long as the die and superblock match.

One example scenario which shows the usefulness of the process of FIG. 1 is when a system comes out of sleep mode. Before going into sleep mode, the system stores metadata, state information, and other information which it will need after or upon wakeup sequentially in superblocks in solid state storage. When the system wakes up, the information is correspondingly read back sequentially. For systems which are heavily worn, the default thresholds will no longer be sufficient and adjusted thresholds will be required. Other systems which do not perform the process of FIG. 1 must (in a worst case scenario) find an adjusted threshold for each read. This can be a very time consuming process and (as described above) a timeout may be triggered, which is unacceptable.

In contrast, systems which perform the process of FIG. 1 will be able to reuse the stored adjusted threshold information, which enables reads to be executed more quickly. For example, in FIG. 2, when coming out of sleep mode, the system may first simultaneously read MSB pages 202 and 206 on die 200 and MSB pages 252 and 256 on die 250, where the MSB pages are associated with superblock 0. Adjusted A and C thresholds are stored for die 200 and die 250, where the superblock number is stored with the stored adjusted threshold information. In FIG. 1, this corresponds to going through the branch which includes steps 104 and 106. Next, the system simultaneously read MSB pages 204 and 208 on die 200 and MSB pages 254 and 258 on die 250. Since there is adjusted threshold information associated with the relevant superblock (i.e., superblock 0) and the dice being read (i.e., die 200 and die 250), the stored adjusted threshold information can be used to perform those reads. In FIG. 1, this corresponds to going through the branch which includes step 112. Determining an adjusted threshold at step 104 can be very time consuming and so skipping step 104 makes the wakeup process go faster.

Although the wakeup example described above only reuses the stored adjusted threshold information once, in many real-world systems, superblocks are so large that blocks associated from the same superblock will be read hundreds or thousands of times in succession during a wakeup. This means that the stored adjusted threshold information can be reused possibly hundreds or thousands of times, resulting in a significant performance improvement.

An alternate way to store and reuse adjusted threshold information would be to store adjusted threshold information for every block. This is an unrealistic and expensive solution since solid state storage may include tens or hundreds of thousands of blocks. This solution would require a prohibitive amount of storage. Instead, the technique described in FIG. 1 offers performance improvement without requiring an excessive amount of storage.

Figure 5:
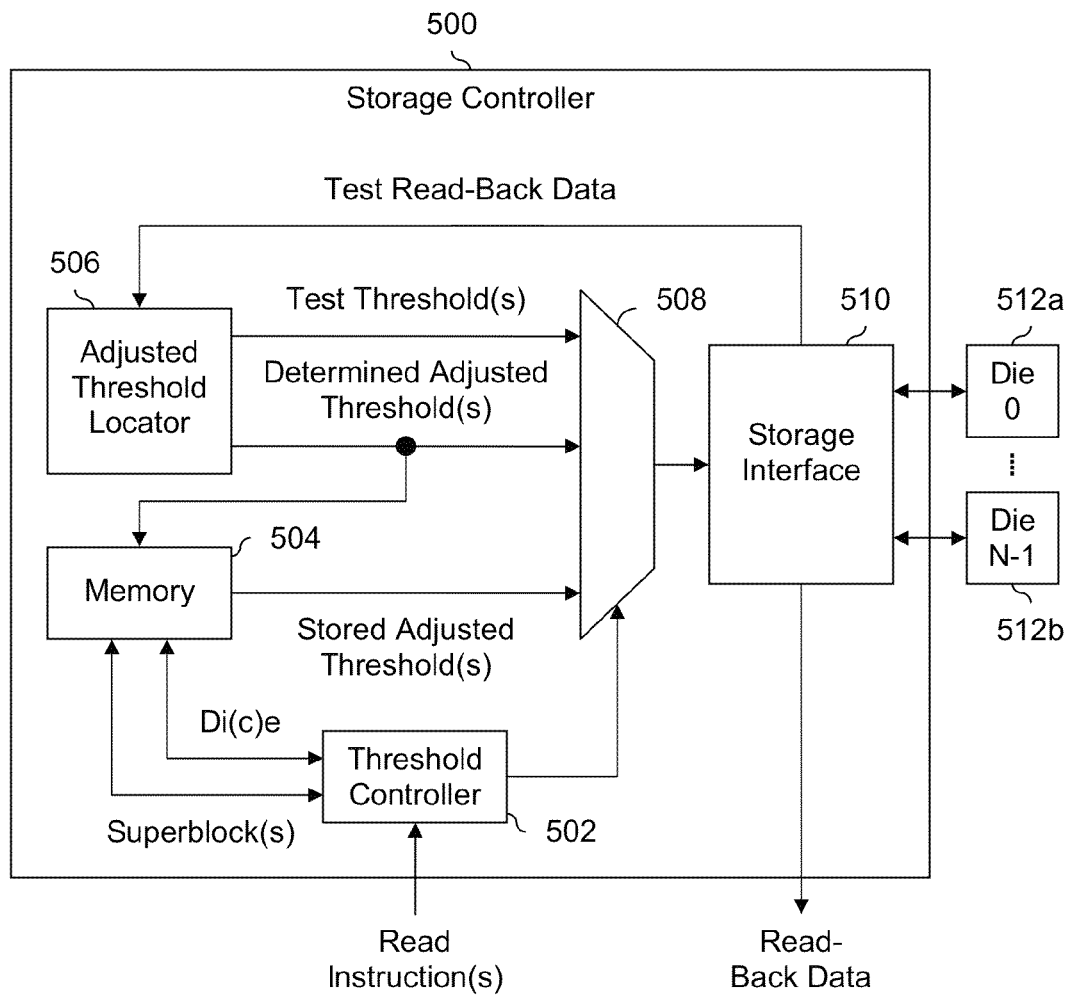
FIG. 5 is a diagram illustrating an embodiment of a storage controller which reuses adjusted threshold information based on die and superblock.

FIG. 5 is a diagram illustrating an embodiment of a storage controller which reuses adjusted threshold information based on die and superblock. Storage controller 500 is one example of a system which performs the process of FIG. 1. In some embodiments, storage controller 500 is a semiconductor device, such as a FPGA or an ASIC. For clarity, components which are normally included in a storage controller but which are not related to the technique are excluded (e.g., write-related components are not shown and an error correction decoder is not shown).

Threshold controller 502 in storage controller 500 receives one or more read instructions. In various embodiments, the read instructions may be from a host or from firmware. The read locations or addresses specified in the instructions may be logical addresses (e.g., logical block addresses) or physical addresses. The read locations may comprise any permitted size or unit or data, such as a superblock or block.

Threshold controller 502 determines what dice and what superblocks are associated with the received read instructions. If needed, a mapping is performed (e.g., from logical to physical), for example to determine what die and/or superblock is being targeted by the read instructions.

In this particular example, it is assumed that storage controller 500 already knows that a default threshold is insufficient to read die 512a-512b. For example, a read using a default threshold may have already been performed and failed (e.g., because the errors contained in the read-back data exceed the error correction capability of the error correction decoder). Or, storage controller 500 may keep track of a program and erase count and when the count has exceeded some threshold, adjusted thresholds are used in place of default thresholds. In any case, storage controller 500 knows that adjusted thresholds are needed to perform the read.

Threshold controller 502 checks memory 504 to determine if adjusted threshold information is stored therein for a given die and superblock being read. In some MLC or tri-level cell (TLC) embodiments, threshold controller 502 ensures that the appropriate threshold information is available (e.g., if an MSB page is being read from MLC storage, then checking that adjusted threshold information for the A threshold and the C threshold is stored for the die and superblock of interest). In this example, memory 504 only stores adjusted threshold information, and not default threshold information (e.g., default thresholds are stored in configurable registers which can be programmed by firmware, as opposed to memory 504).

If memory 504 does not have stored adjusted threshold information for the die and superblock of interest, then adjusted threshold locator 506 is used to determine one or more adjusted thresholds. This is an example of step 104 in FIG. 1. In some embodiments, adjusted threshold locator 506 is an optimal threshold estimator (i.e., which attempts to find the best or optimal adjusted threshold, as opposed to an adjusted threshold locator which attempts to find an adjusted threshold which is merely sufficient or better without necessarily being the best). First, one or more test thresholds are used to read any number of dice 512a-512b via multiplexer 508 (controlled by threshold controller 502) and storage interface 510. The resulting test data is returned via storage interface 510 to adjusted threshold locator 506. Adjusted threshold locator 506 may repeat this test reading process any number of times. Using the test results, one or more adjusted thresholds are determined by adjusted threshold locator 506.

The determined adjusted thresholds are used to read any number of die 512a-512b via multiplexer 508, and the read-back data is output (e.g., to firmware or a host). Unlike the test reads, this read-back data is output, for example to firmware or the host. The determined adjusted threshold(s) are also stored in memory 504, where they are associated with the relevant die and superblock. This is an example of step 106 from FIG. 1. Naturally, if memory 504 is full, then old adjusted threshold information is evicted to make room for the new adjusted threshold information. Any appropriate eviction technique may be used (e.g., the oldest adjusted threshold information is evicted first).

If, however, memory 504 contains stored adjusted threshold information for the die and superblock of interest, then the stored adjusted thresholds are used to read die 512a-512b via multiplexer 508 and storage interface 510 and the read-back data is output, for example to firmware or the host. This is an example of step 112 from FIG. 1.

To further improve performance, in some embodiments read instructions are reordered in order to more fully utilize the stored adjusted threshold information. The following figure shows one such example.

Figure 6:
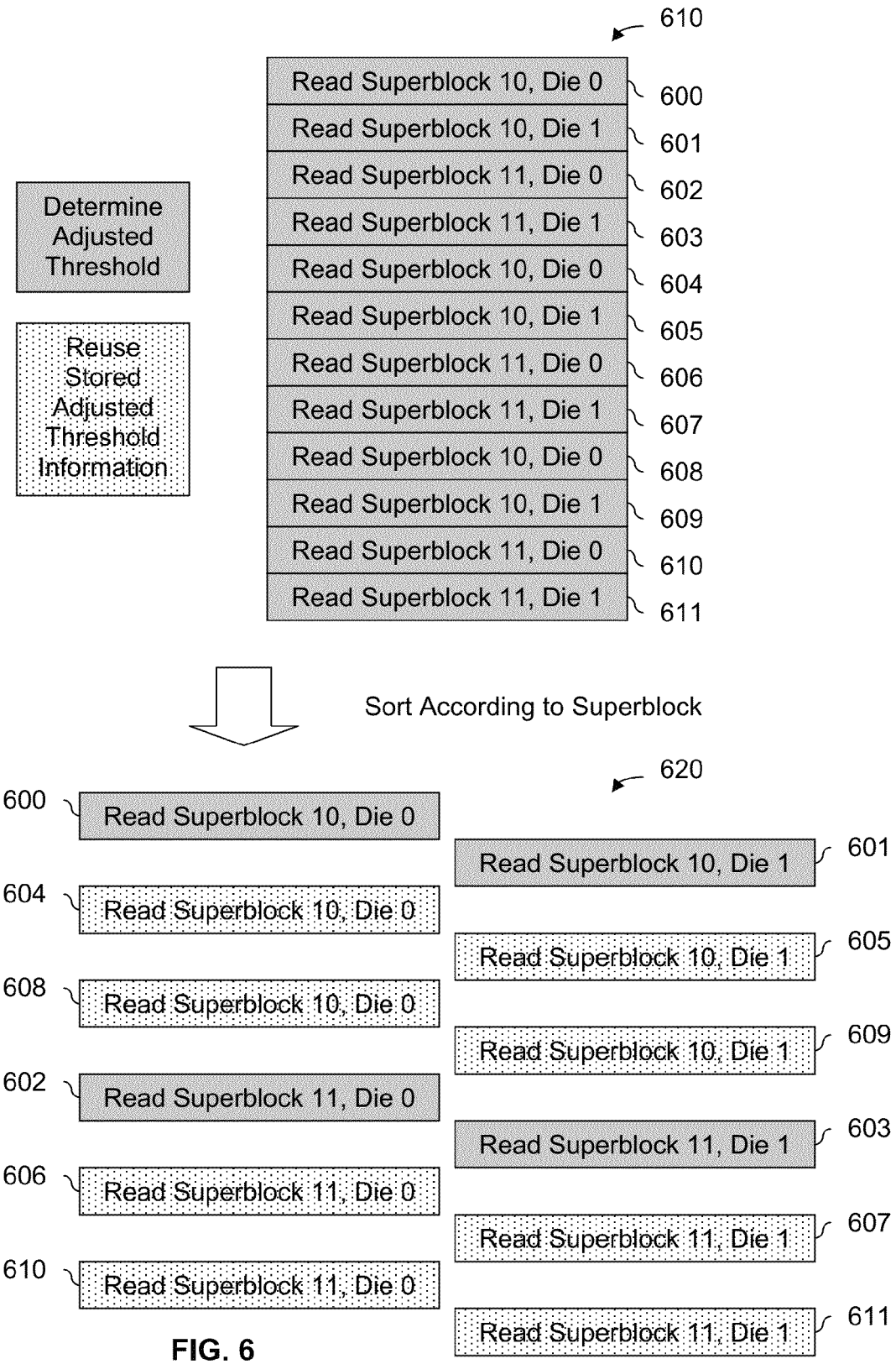
FIG. 6 is a diagram illustrating an embodiment of reads which are reordered in order to improve performance.

FIG. 6 is a diagram illustrating an embodiment of reads which are reordered in order to improve performance. In the example shown, 12 read instructions are received. Read 600 is associated with superblock 10 and die 0; read 601 is associated with superblock 10 and die 1; read 602 is associated with superblock 11 and die 0; read 603 is associated with superblock 11 and die 1; read 604 is associated with superblock 10 and die 0; read 605 is associated with superblock 10 and die 1; read 606 is associated with superblock 11 and die 0; read 607 is associated with superblock 11 and die 1; read 608 is associated with superblock 10 and die 0; read 609 is associated with superblock 10 and die 1; read 610 is associated with superblock 11 and die 0; read 611 is associated with superblock 11 and die 1. In various embodiments, the reads may be to any portion of the specified superblock on the specified die. In some embodiments, the read instructions shown are obtained after performing some mapping in order to obtain the superblock of interest and/or the die of interest.

Diagram 610 shows the reads in the order in which they are received. In this particular example, a single set of adjusted threshold information is stored for each die. As such, the sequence of reads shown in diagram 610 is a worst case scenario because none of the stored adjusted threshold information for die 0 and die 1 will be reused. For each read, adjusted thresholds must be determined and so the total read time is relatively long.

In order to better utilize the stored adjusted threshold information, the reads shown in diagram 610 are reordered so that reads associated with the same superblock are grouped together. This may be done in a variety of ways and in this example the reads are sorted in ascending order according to superblock (e.g., without taking into consideration which die a read is associated with, since adjusted threshold information is stored for each die). Any appropriate reordering technique may be used.

Diagram 620 shows the reads after being reordered in ascending order according to superblock. In order to more clearly show which reads must have adjusted thresholds determined for them and which ones can reuse stored adjusted threshold information, reads associated with die 0 are shown in a left column and reads associated with die 1 are shown in a right column. As is shown in the example, with the new ordering, 8 out of the 12 reads can reuse stored adjusted threshold information; adjusted thresholds only need to be determined for reads 600, 601, 602, and 603. As is shown herein, reordering can improve the overall performance of the system by reducing the total read time.

Figure 7:
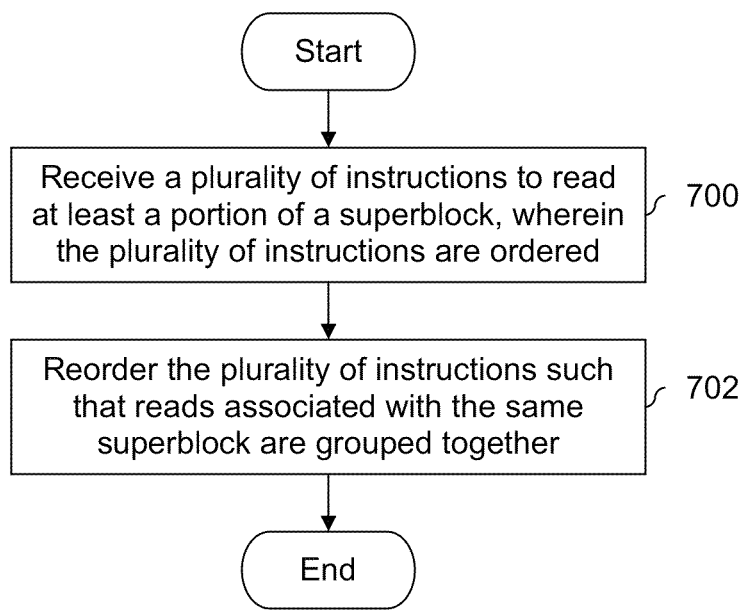
FIG. 7 is a flowchart illustrating an embodiment of a process for reordering a sequence of reads.

FIG. 7 is a flowchart illustrating an embodiment of a process for reordering a sequence of reads. In some embodiments, the process is performed before the process shown in FIG. 1 in order to increase the utilization of stored adjusted threshold information and improve performance. At 700, a plurality of instructions to read at least a portion of a superblock is received, wherein the plurality of instructions are ordered. Diagram 610 in FIG. 6 shows one example. As described above, a received instruction may not necessarily explicitly specify the superblock, but the superblock may be determined via some mapping.

At 702, the plurality of instructions are reordered such that reads associated with the same superblock are grouped together. Diagram 620 in FIG. 6 shows one example of a reordered sequence. As described above, in one example, the reordering is done by sorting the reads in ascending order by superblock. In some embodiments, what die a given read is associated with is ignored during sorting.

Figure 8:
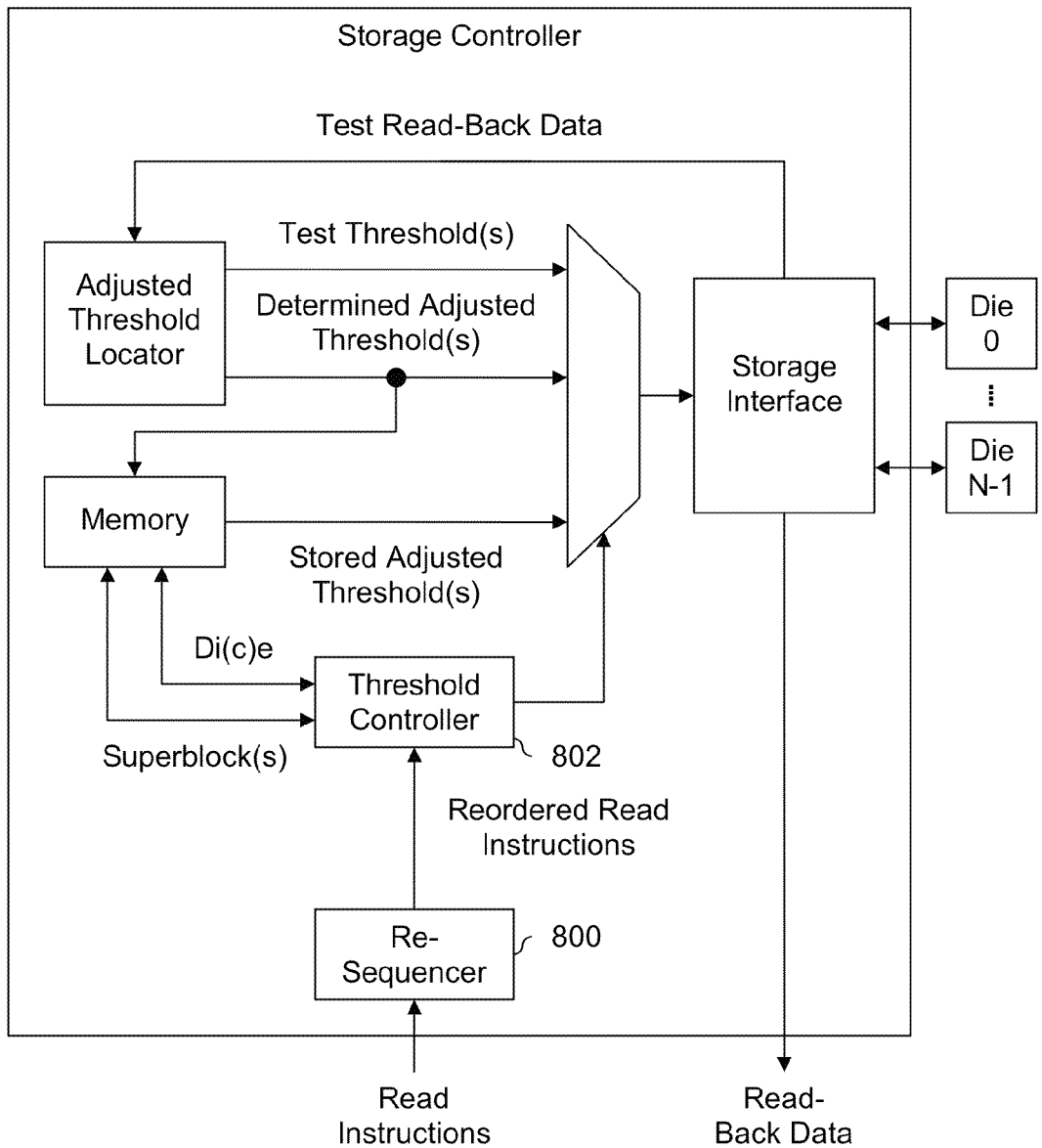
FIG. 8 is a diagram illustrating an embodiment of a storage controller which sorts read instructions before being processed by a threshold controller.

FIG. 8 is a diagram illustrating an embodiment of a storage controller which sorts read instructions before being processed by a threshold controller. In the example shown, read instructions are received by resequencer 800. The read instructions are reordered so that reads associated with the same superblock are grouped together. The reordered read instructions are then passed from resequencer 800 to threshold controller 802.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for reusing adjusted threshold information, comprising:
   a threshold controller configured to:
      receive an instruction to read at least a portion of a superblock, wherein the superblock is stored on at least a first solid state storage die; and
      determine whether adjusted threshold information, associated with the first solid state storage die and the superblock, is stored or not stored;
   an adjusted threshold locator configured to, in an event it is determined that the adjusted threshold information is not stored, determine an adjusted threshold; and
   a storage interface configured to:
      in an event it is determined that the adjusted threshold information is not stored, perform a read on the first solid state storage die using the determined adjusted threshold; and
      in an event it is determined that the adjusted threshold information is stored, perform a read on the first solid state storage die using the stored adjusted threshold information.

2. The system of claim 1, wherein the system is implemented using a semiconductor device, including one or more of the following: a field-programmable gate array (FPGA) or an application-specific integrated circuit (ASIC).

3. The system of claim 1, wherein the first solid state storage die includes one or more of the following: single-level cell (SLC) storage, multi-level cell (MLC) storage, or tri-level cell (TLC) storage.

4. The system of claim 1, wherein the stored adjusted threshold information includes an offset.

5. The system of claim 1, wherein the storage interface is further configured to perform a read on the first solid state storage die using a default threshold, at least while a program and erase count is less than a threshold.

6. The system of claim 1, wherein the storage interface is further configured to perform a read on the first solid state storage die using a default threshold, at least while an error correction capability of an error correction decoder is not exceeded.

7. The system of claim 1, wherein:
   the adjusted threshold locator is configured to determine the adjusted threshold, including by determining the adjusted threshold for a first block that is associated with the first solid state storage die and the superblock; and
   the storage interface is configured to perform the read on the first solid state storage die using the stored adjusted threshold information, including by reading a second block, associated with the first solid state storage die and the superblock, using the adjusted threshold that is determined for the first block.

8. The system of claim 1, wherein the adjusted threshold information is stored in volatile memory.

9. The system of claim 1, wherein the adjusted threshold locator includes an optimal threshold estimator that is configured to estimate an optimal threshold which corresponds to a voltage at which two adjacent distributions intersect.

10. The system of claim 1, wherein the adjusted threshold locator is configured to determine the adjusted threshold, including by performing one or more test reads.

11. The system of claim 1 further comprising a resequencer configured to:
   receive a plurality of instructions to read at least a portion of a superblock, wherein the plurality of instructions are ordered; and
   reorder the plurality of instructions such that reads associated with the same superblock are grouped together.

12. A method for reusing adjusted threshold information, comprising:
   receiving an instruction to read at least a portion of a superblock, wherein the superblock is stored on at least a first solid state storage die;
   determining whether adjusted threshold information, associated with the first solid state storage die and the superblock, is stored or not stored;
   in an event it is determined that the adjusted threshold information is not stored:
      determining an adjusted threshold; and
      performing a read on the first solid state storage die using the determined adjusted threshold; and
   in an event it is determined that the adjusted threshold information is stored, performing a read on the first solid state storage die using the stored adjusted threshold information.

13. The method of claim 12, wherein the method is performed using a semiconductor device, including one or more of the following: a field-programmable gate array (FPGA) or an application-specific integrated circuit (ASIC).

14. The method of claim 12, wherein the first solid state storage die includes one or more of the following: single-level cell (SLC) storage, multi-level cell (MLC) storage, or tri-level cell (TLC) storage.

15. The method of claim 12, wherein the stored adjusted threshold information includes an offset.

16. The method of claim 12 further comprising performing a read on the first solid state storage die using a default threshold, at least while a program and erase count is less than a threshold.

17. The method of claim 12 further comprising performing a read on the first solid state storage die using a default threshold, at least while an error correction capability of an error correction decoder is not exceeded.

18. The method of claim 12, wherein:
the step of determining an adjusted threshold includes determining the adjusted threshold for a first block that is associated with the first solid state storage die and the superblock; and
the step of performing a read on the first solid state storage die using the stored adjusted threshold information includes reading a second block, associated with the first solid state storage die and the superblock, using the adjusted threshold that is determined for the first block.

19. The method of claim 12, wherein the adjusted threshold information is stored in volatile memory.

20. The method of claim 12, wherein the step of determining an adjusted threshold includes estimating an optimal threshold which corresponds to a voltage at which two adjacent distributions intersect.

21. The method of claim 12, wherein the step of determining an adjusted threshold includes performing one or more test reads.

22. The method of claim 12 further comprising:
receiving a plurality of instructions to read at least a portion of a superblock, wherein the plurality of instructions are ordered; and
reordering the plurality of instructions such that reads associated with the same superblock are grouped together.

23. A computer program product for reusing adjusted threshold information, the computer program product being embodied in a non-transitory computer readable storage medium and comprising computer instructions for causing a computer to perform:
receiving an instruction to read at least a portion of a superblock, wherein the superblock is stored on at least a first solid state storage die;
determining whether adjusted threshold information, associated with the first solid state storage die and the superblock, is stored or not stored;
in an event it is determined that the adjusted threshold information is not stored:
determining an adjusted threshold; and
performing a read on the first solid state storage die using the determined adjusted threshold; and
in an event it is determined that the adjusted threshold information is stored, performing a read on the first solid state storage die using the stored adjusted threshold information.

* * * * *